United States Patent
Sheng

(10) Patent No.: US 8,245,181 B2
(45) Date of Patent: Aug. 14, 2012

(54) PRINTED CIRCUIT BOARD LAYOUT SYSTEM AND METHOD THEREOF

(75) Inventor: Xiao-Cheng Sheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 256 days.

(21) Appl. No.: 12/813,522

(22) Filed: Jun. 11, 2010

(65) Prior Publication Data

US 2011/0078643 A1    Mar. 31, 2011

(30) Foreign Application Priority Data

Sep. 30, 2009    (CN) .......................... 2009 1 0308041

(51) Int. Cl.
*G06F 17/50*    (2006.01)
(52) U.S. Cl. .................. 716/139; 716/136; 716/137
(58) Field of Classification Search ................ None
See application file for complete search history.

(56) References Cited

U.S. PATENT DOCUMENTS

| 6,077,307 | A  | * | 6/2000 | Benzel et al. ............... 716/52 |
| 6,341,366 | B1 | * | 1/2002 | Wang et al. ................. 716/112 |
| 7,322,019 | B2 | * | 1/2008 | Sato et al. .................. 716/112 |
| 7,412,683 | B2 | * | 8/2008 | Mimura et al. .............. 716/137 |
| 7,643,896 | B2 | * | 1/2010 | Hayashida ................... 700/97 |
| 7,865,857 | B1 | * | 1/2011 | Chopra et al. ............... 716/119 |
| 2004/0194045 | A1 | * | 9/2004 | Kobayashi .................. 716/10 |

FOREIGN PATENT DOCUMENTS

| CN | 1987876 A | 6/2007 |
| CN | 101470767 A | 7/2009 |

* cited by examiner

*Primary Examiner* — Leigh Garbowski
(74) *Attorney, Agent, or Firm* — Altis Law Group, Inc.

(57) ABSTRACT

A printed circuit board layout system and a method thereof are provided. The method includes the following steps: obtaining corresponding outlines of selected component and unselected components in response to a user selecting one component; obtaining the range value; generating a reference outline according to the obtained range value and outline of the selected component; performing an intersection operation according to the reference outline and outlines of the unselected components, and determining whether one component is associated within the reference outline; marking and displaying the outlines of the corresponding unselected components when the unselected components are associated within the reference outline.

10 Claims, 4 Drawing Sheets

PRINTED CIRCUIT BOARD LAYOUT SYSTEM AND METHOD THEREOF

BACKGROUND

1. Technical Field

The present disclosure relates to the printed circuit board (PCB) layout field and, particularly, to a PCB layout system and a search method thereof.

2. Description of Related Art

When designing PCBs using software, different components have different height values and different safe distances. It is better not to set components to close to each other on the PCB in order to conveniently wiring or there could be electromagnetic interference created between the components. However, conventional software can only find overlapped components of the PCB, and cannot find components within the safe distances.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
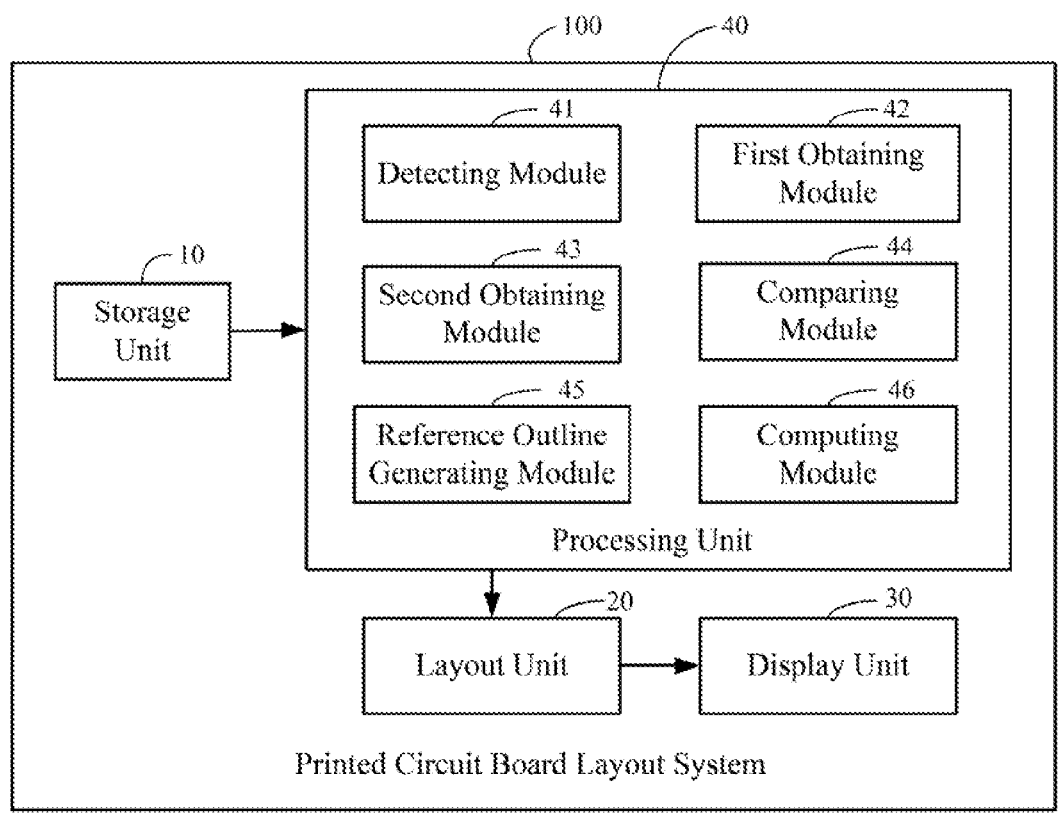
FIG. 1 is a block diagram of a PCB layout system in accordance with an exemplary embodiment.

Referring to FIG. 1, a PCB layout system 100 includes a storage unit 10, a layout unit 20, a display unit 30, and a processing unit 40.

The storage unit 10 stores a plurality of PCB layout files. The PCB layout file is created based on a schematic circuit diagram, similar to the process of converting schematic circuit diagrams to PCB layouts by any conventional PCB layout software. The PCB layout file includes multiple outline information, defining multiple component shapes, and height values, defining components' heights. The outline information may include a plurality of coordinates defining a plurality of points joined together to form the outline.

The layout unit 20 is configured to create PCB layout files based on the schematic circuit diagrams. The display unit 30 is configured to display the created PCB layout files and a user interface 11.

Figure 2:
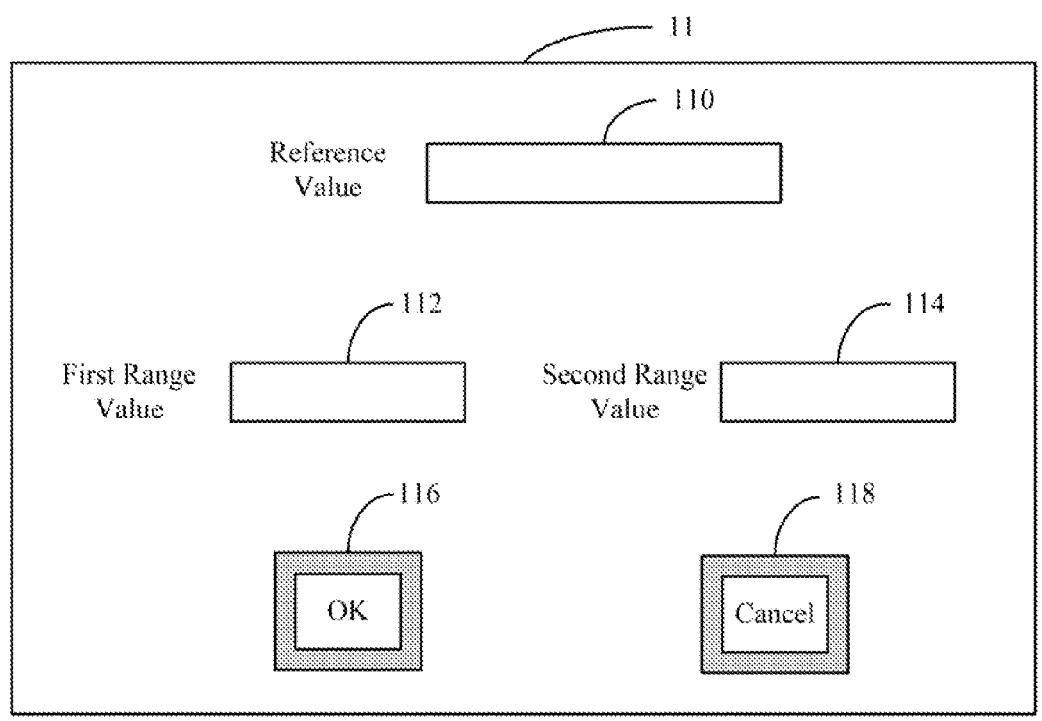
FIG. 2 is a user interface schematic diagram of the PCB layout system of FIG. 1.

Referring to FIG. 2, the user interface 11, such as an operation interface of a computer monitor, includes a reference value input box 110, a first range value input box 112 and a second range value input box 114. The reference value input box 110 is configured to receive a comparison value in response to a user input. The reference value is a value to be compared with the height value of a selected component to determine whether the component is a high component or a low component. For example, when the height value of the selected component is greater than the reference value, it is a high component, and when the height value of the selected component is less or equal to the reference value, it is a low component. The reference value is determined according to the actual demand by the user. The first range value input box 112 is configured to receive a first range value in response to the user input. The second range value input box 114 is configured to receive a second range value in response to the user input. The first range value is an extension distance from the outline of the component corresponding to the low component, and the second range value is an extension distance from the outline of the component corresponding to the high component. The high component and the low component have different range values.

The user interface 11 further includes an OK button 116 and a cancel button 118. The user can select either the OK button 116 or the cancel button 118 after inputting the above parameters. The OK button 116 and the cancel button 118 are used to accept or reject the input parameters.

The processing unit 40 includes a detecting module 41, a first obtaining module 42, a second obtaining module 43, a comparing module 44, a reference outline generating module 45, and a computing module 46.

The detecting module 41 is configured to detect whether corresponding reference value and range values are generated according to the input. In detail, the first range value of the first range value input box 112 is a predetermined default value, it can also be changed in the first range value input box 112 by the user.

The first obtaining module 42 is configured to obtain the reference value, the first range value and the second range value when the detecting module 41 detects the corresponding reference value and range values input.

The second obtaining module 43 is configured to obtain the outline and the height value of a component selected by the layout unit 20, responding to the operation of the user selecting one component on the PCB. The second obtaining module 43 is further configured to obtain corresponding outlines that unselected components on the PCB.

The comparing module 44 is configured to compare the reference value of the first obtaining module 42 with the height value of the selected component of the second obtaining module 43, and determine the selected component is a high component or a low component. In detail, the component is a high component when the height value is greater than the reference value; otherwise, the component is a low component.

The reference outline generating module 45 is configured to generate a reference outline according to the corresponding range value and outline of the selected component when the comparing module 44 determines the selected component is a high component or a low component. For example, the reference value is 4 mm, the first range value is 3 mm, and the second range value is 5 mm. The height value of the selected component is 6 mm. The comparing module compares the 4 mm with the 6 mm, and then determines that the selected component is a high component. The reference outline generating module 45 extends the outline of the selected component according to the second range value to obtain a reference outline. The shape of the reference outline is an extension shape of the selected component extends a second range value along all around of outline itself.

Figure 3:
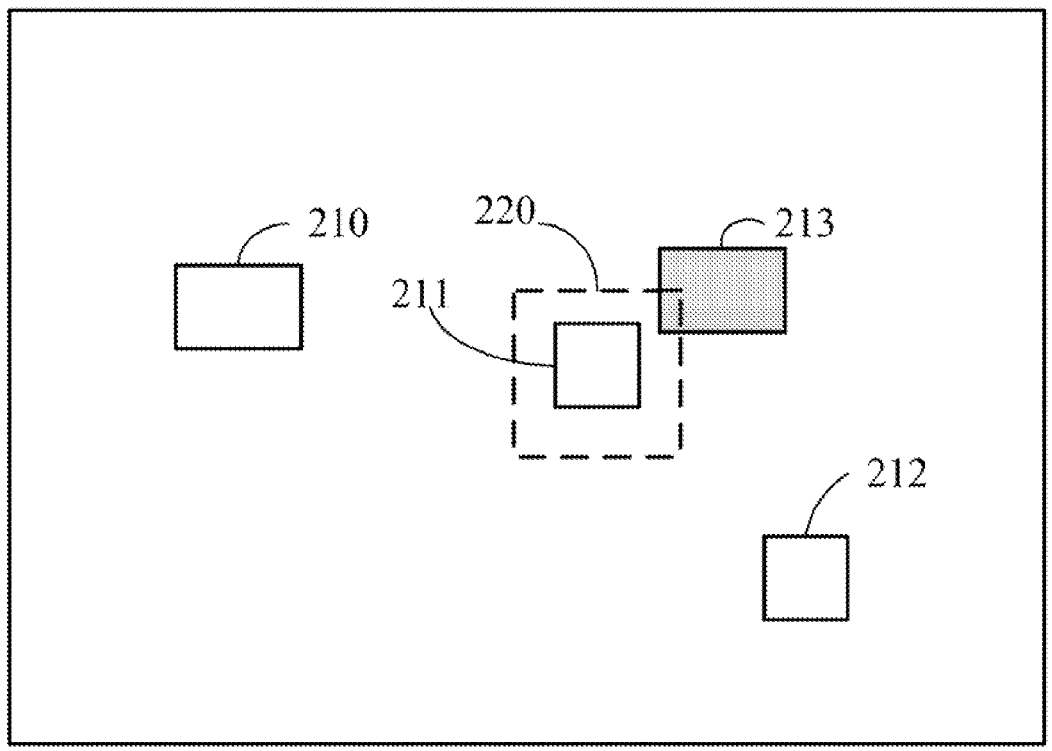
FIG. 3 is a schematic diagram of search result used by the PCB layout system of FIG. 1.

The computing module 46 is configured to determine whether one component is associated within the reference outline. In detail, referring to FIG. 3, the layout unit 20 selects the component 211 in response to operation of the user. The reference outline generating module 45 generates a reference outline 220. The computing module 46 performs an intersection operation according to the reference outline 220 and one outline of the unselected components (e.g., 210, 212, and 213) that are obtained by the second obtaining module 43 respectively. If the components have a safe distance, the computing module 46 determines there is no component associated within the reference outline 220; otherwise, the computing module 46 determines there is a component that is intersected (does not have a safe distance) with the reference outline 220.

The layout unit 20 marks and provides the outline of the unselected associated components to the display unit 30 according to the determined result of the computing module. The display unit 30 displays the corresponding marked component on the PCB (as see in FIG. 3).

In another embodiment, the first range value is a predetermined default value. When the layout unit 20 selects the component 211, the first obtaining module 42 obtains the first range value, the second obtaining module 43 obtains the outline of the selected components 211 and corresponding outlines that unselected components (e.g., 210, 212, 213) on the PCB. The reference outline generating module 45 generates a reference outline 220 according to the obtained first range value and outline of the selected component 211. The computing module 46 performs an intersection operation according to the reference outline 220 and obtained outlines of unselected components, and the layout unit 20 marks and provides the unselected associated components to the display unit 30 to display, when the components are intersecting.

Figure 4:
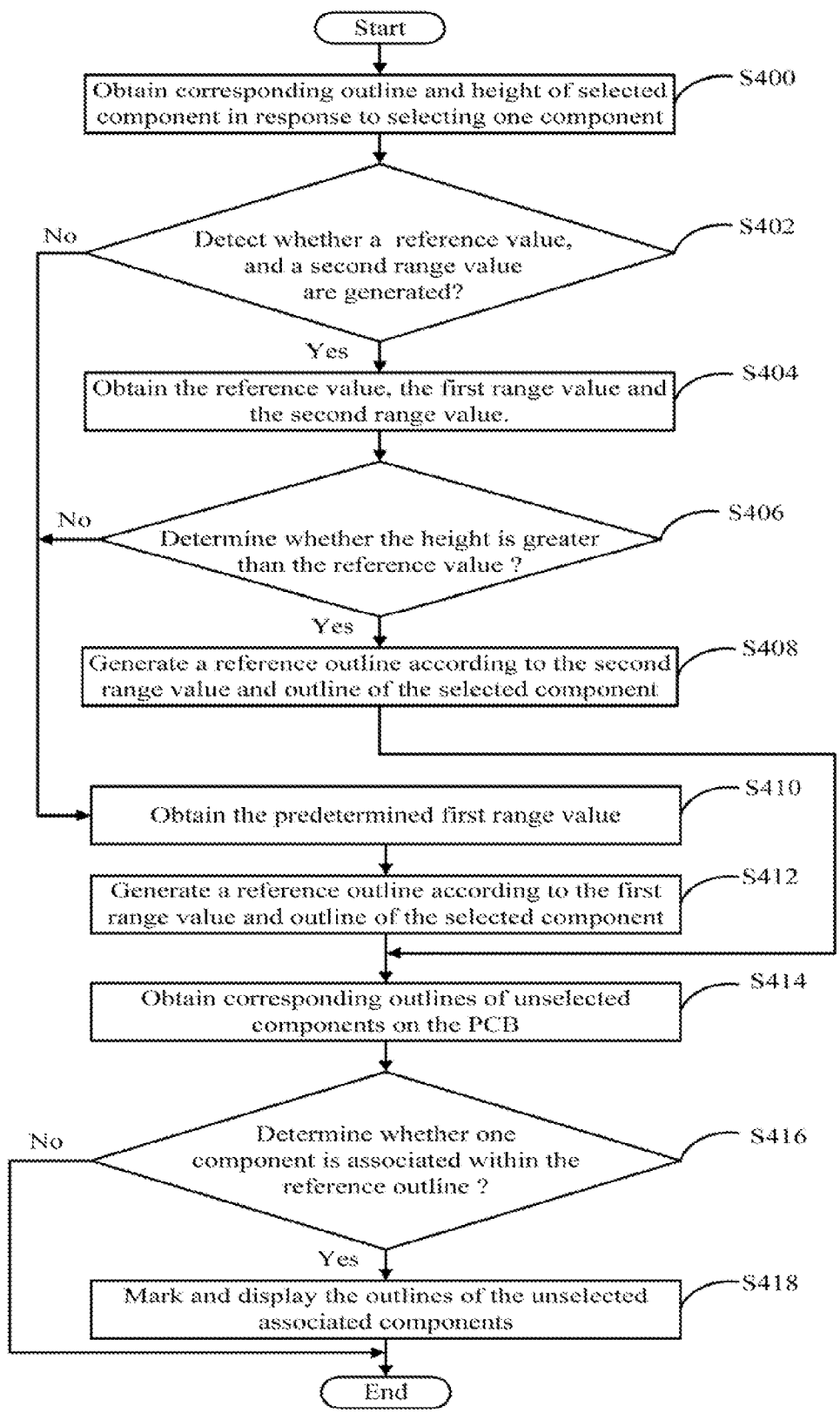
FIG. 4 is a flowchart of a search method of the PCB layout system in accordance with an exemplary embodiment.

FIG. 4 is a flowchart of a search method of the PCB layout system in accordance with an exemplary embodiment. This method is applying for a PCB layout system.

In step S400, the layout unit 20 selects one component on the displayed PCB in response to operation of the user, The second obtaining module 43 obtains a corresponding outline and height value of the selected component.

In step S402, The detecting module 41 detects whether the reference value, and the second range value are generated. If yes, the process goes to S404, and if not, the process goes to S410.

In step S404, The first obtaining module 42 obtains the reference value, the first range value and the second range value.

In step S406, the comparing module 44 determines whether the height value is greater than the reference value. If yes, the process goes to 408, and if not, the process goes to S410.

In step S408, the reference outline generating module 45 generates a reference outline 220 according to the second range value and outline of the selected component. Then the process goes to S414.

In step S410, the first obtaining module 42 obtains the predetermined first range value.

In step S412, the reference outline generating module 45 generates a reference outline according to the first range value and outline of the selected component.

In step S414, the second obtaining module 43 obtains corresponding outlines of unselected components on the PCB.

In step S416, the computing module 46 performs an intersection operation according to the reference outline 220 and one outline of the unselected components respectively, and determines whether one component is associated within the reference outline 220. The process goes to S418 when the components are intersecting; and the process end when the components have a safe distance.

In step S418, the layout unit 20 marks and provides the outlines of the unselected associated components to the display unit 30 according to the determined result of the computing module 46. The display unit 30 displays the corresponding marked components on the PCB.

By the application of the PCB layout system 100 and method thereof, the PCB layout system 100 responds to an operation of selecting one components on the PCB, automatically obtains the outline and height value of the selected component and the reference value, compares the height value and the reference value to select a first range value or a second range value. The PCB layout system 100 generates a reference outline according to the corresponding range value and outline of the selected component, performs an intersection operation according to the reference outline and outlines of the unselected components to search components in the distance of corresponding range value, marks and displays the searched components on the display unit 30.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board (PCB) layout system, comprising:
 a storage unit to store a plurality of PCB layout files and a range value, wherein each of the PCB layout files comprises multiple outline information defining multiple component shapes;
 a layout unit to create PCB layout files based on schematic circuit diagrams;
 a display unit to display the created PCB layout files; and
 a processing unit comprising:
  a first obtaining module to obtain the range value;
  a second obtaining module to obtain outline of a component selected by the layout unit and corresponding outlines of unselected components, in response to selecting one component on the PCB by a user;
  a reference outline generating module to generate a reference outline according to the corresponding range value and outline of the selected component; and
  a computing module to determine whether one component is associated within the reference outline;
 wherein the layout unit marks and provides the outline of an unselected component to the display unit when the computing module determines that one component is associated within the reference outline, and the display unit displays the corresponding marked components on the PCB.

2. The PCB layout system as described in claim 1, wherein the range value comprises a first range value and a second range value, one PCB layout file comprises height values defining components' heights;
 the processing unit further comprises a detecting module, which is to detect whether a reference value and range values are generated according to the input, the first obtaining module obtains the reference value, the first range value and the second range value when the detecting module detects the corresponding reference value and range values input;

the second obtaining module is further to obtain height value corresponding to selected component, in response to selecting one component on the displayed PCB by the user.

3. The PCB layout system as described in claim 2, wherein the processing unit further comprises a comparing module, which is to compare the reference value of the first obtaining module with the height value of the selected component of the second obtaining module, and determine the selected component is a high component or a low component;

the reference outline generating module generates a reference outline according to the first range value and outline of the selected component when the comparing module determines the selected component is a low component; and generates a reference outline according to the second range value and outline of the selected component when the comparing module determines the selected component is a high component.

4. The PCB layout system as described in claim 3, wherein the comparing module determines that the selected component is a high component when height value of the selected component is greater than the reference value, otherwise, the selected component is a low component.

5. The system as described in claim 1, wherein the outline information comprises a plurality of coordinates defining a plurality of points joined together to form the outline.

6. The system as described in claim 1, wherein the computing module performs an intersection operation according to the reference outline and one outline of the unselected components, and determines there is no component associated within the reference outline when the components have a safe distance, otherwise, the component is associated within the reference outline.

7. A search method for a printed circuit board (PCB) layout system, the printed circuit board layout system comprises a storage unit that stores a plurality of PCB layout files and a range value, wherein each of the PCB layout files comprises multiple outline information defining multiple component shapes, the method comprising:

(a) obtaining corresponding outlines of selected component and unselected components in response to a user selecting one component;

(b) obtaining the range value;

(c) generating a reference outline according to the obtained range value and outline of the selected component;

(d) performing an intersection operation according to the reference outline and outlines of the unselected components, and determining whether one component is associated within the reference outline;

(e) marking and displaying the outlines of the corresponding unselected components when the unselected components are associated within the reference outline.

8. The search method as described in claim 7, wherein one PCB layout file comprises height values, the step (a) further comprising:

obtaining height value of the selected component.

9. The search method as described in claim 7, wherein the range value comprises a first range value and a second range value, the step (b) further comprising:

obtaining a reference value, the first range value and the second range value when detecting the corresponding reference value and range value input.

10. The search method as described in claim 7, the step (c) further comprising:

comparing whether the height value is greater than the reference value;

generating a reference outline according to the second range value and outline of the selected component if the height value is greater than the reference value;

generating a reference outline according to the first range value and outline of the selected component if the height value is not greater than the reference value.

* * * * *